US008076990B2

(12) United States Patent
Pischl

(10) Patent No.: US 8,076,990 B2

(45) Date of Patent: Dec. 13, 2011

(54) COMMUNICATIONS MEDIUM CONNECTOR WITH INTEGRATED COMMON-MODE NOISE SUPPRESSION

(75) Inventor: Neven Pischl, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 104 days.

(21) Appl. No.: 12/454,586

(22) Filed: May 20, 2009

(65) Prior Publication Data

US 2010/0267283 A1 Oct. 21, 2010

Related U.S. Application Data

(60) Provisional application No. 61/212,700, filed on Apr. 15, 2009.

(51) Int. Cl.
*H04B 3/28* (2006.01)
*H03H 7/00* (2006.01)

(52) U.S. Cl. ........... 333/12; 333/177; 333/181; 333/185

(58) Field of Classification Search .................... 333/12, 333/177, 181, 185; 439/620.11, 620.12, 439/620.13
See application file for complete search history.

(56) References Cited

U.S. PATENT DOCUMENTS 7,575,478 B1 * 8/2009 Wei ......................... 439/620.11

* cited by examiner

*Primary Examiner* — Robert Pascal
*Assistant Examiner* — Kimberly Glenn
(74) *Attorney, Agent, or Firm* — Farjami & Farjami LLP

(57) ABSTRACT

According to one exemplary embodiment, a connector for coupling a communications medium to an electronic device includes a common-mode suppression block coupled to a number of connector pins. The common-mode suppression block is configured to reduce common-mode noise coupling between the communications medium and the connector pins in the connector. The common-mode suppression block is further configured to provide substantially no attenuation to a differential-mode signal. In one embodiment, the communications medium is an Ethernet cable and the connector is an Ethernet plug. In one embodiment, the common-mode suppression block comprises common-mode chokes. In one embodiment, the connector is an RJ45 plug.

20 Claims, 4 Drawing Sheets

COMMUNICATIONS MEDIUM CONNECTOR WITH INTEGRATED COMMON-MODE NOISE SUPPRESSION

The present application claims the benefit of and priority to a pending provisional patent application entitled "Common-Mode Protection for Media-Side of Communications Connectors," Ser. No. 61/212,700 filed on Apr. 15, 2009. The disclosure in that pending provisional application is hereby incorporated fully by reference into the present application.

BACKGROUND OF THE INVENTION

1. Field of the Invention

The present invention is generally in the field of electronic circuits and interconnections. More particularly, the invention is in the field of communications circuits and interconnections.

2. Background Art

Electronic devices, such as Ethernet devices and other types of communications devices, can communicate via communications media, such as Ethernet cables. A communications medium, such as an Ethernet cable, can include, for example, two or more differential pairs of wires coupled to corresponding pins on a connector, such as an RJ45 plug, which can be connected to a corresponding receptacle on an electronic device, such as an Ethernet device. However, a communications medium, such as an Ethernet cable, is susceptible to common-mode (CM) noise, which can be coupled to the communications medium from nearby electronic devices, such as radio frequency (RF) transmitters, cell phones, lightning discharges, electrostatic discharges, and the like. A portion of the CM noise on the communications medium can be converted by pins in the connector to differential-mode (DM) noise, which can undesirably affect device operation. Conversely, a portion of a DM signal generated by the electronic device can be converted by the connector pins to CM noise, which can undesirably increase device EMI emission.

In a conventional approach, CM noise suppression components, such as CM chokes and transformers, can be place on a circuit board in the electronic device, such as an Ethernet device, and/or integrated into a receptacle on the device to reduce CM noise. However, CM noise suppression components that are located within the electronic device cannot attenuate DM noise that has been coupled into the device from a connector attached to the communications medium, where the DM noise has been converted from CM noise on the communications medium by the connector pins.

In another conventional approach, CM noise coupling between the communications medium, such as an Ethernet cable, and the electronic device can be reduced by placing a clamp-on ferrite choke on the communications medium close to an attached connector that is plugged into the device receptacle. However, to significantly reduce CM noise on the communications medium, a large-size clamp-on ferrite choke is required, which is undesirable. Also, this approach is impractical where a large number of connectors are adjacent to one another, as required in, for example, a multi-port communications device, such as an Ethernet switch.

SUMMARY OF THE INVENTION

Communications medium connector with integrated common-mode noise suppression substantially as shown in and/ or described in connection with at least one of the figures, and as set forth more completely in the claims.

DETAILED DESCRIPTION OF THE INVENTION

The present invention is directed to a communications medium connector with integrated common-mode noise suppression. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
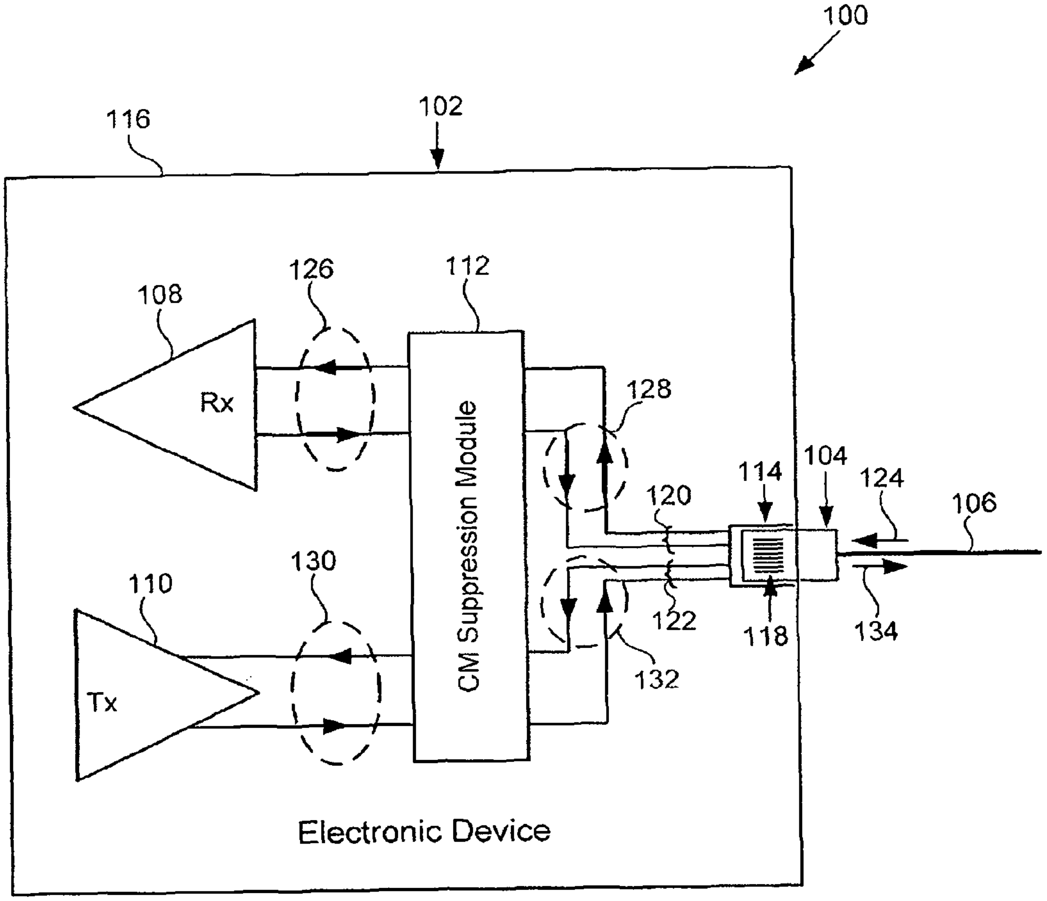
Fig. 1 (Prior Art)
FIG. 1 illustrates a diagram of an exemplary electronic device coupled to an exemplary communications medium via an exemplary conventional connector.

FIG. 1 shows a diagram of an exemplary conventional communications system including an exemplary electronic device coupled to an exemplary communications medium. In FIG. 1, conventional communications system 100 includes electronic device 102, conventional connector 104, and communications medium 106, where conventional connector 104 couples communications medium 106 to electronic device 102. Electronic device 102 includes receiver 108, transmitter 110, CM (common-mode) suppression module 112, receptacle 114, and circuit board 116 and conventional connector 104 includes connector pins 118. Electronic device 102 can be a communications device, such as an Ethernet device, which can be, for example, an Ethernet switch or an Ethernet card in a personal computer or a server. Communications medium 106 can be, for example, a cable, such as an Ethernet cable. For example, communications medium 106 can be a category (CAT) 5, CAT 6A, or other type of Ethernet cable.

As shown in FIG. 1, communications medium 106 is coupled via connector 104 to receptacle 114, which can be mounted on circuit board 116 of electronic device 102 or otherwise attached to electronic device 102. Communications medium 106 (e.g. an Ethernet cable) can include multiple differential pairs, where each differential pair comprises a twisted pair of wires. Connector 104, which is attached to communications medium 106, can be an Ethernet plug, such as an RJ45 plug, which is an 8-pin modular plug. Receptacle 114 can be an Ethernet jack, such as an RJ45 jack.

Also shown in FIG. 1, a differential pair (not shown in FIG. 1) in communications medium 106 is coupled to differential inputs of receiver 108 via a correspond pair of connector pins

118, differential lines 120, and CM suppression module 112, which is mounted on circuit board 116. CM suppression module 112 can comprise one or more CM chokes and/or one or more transformers for providing CM noise suppression. The CM chokes can have, for example, wire-wound ferrite cores. CM suppression module 112 can be configured to attenuate or suppress CM noise and to allow DM (differential mode) signals to pass through with substantially no attenuation.

Further shown in FIG. 1, another differential pair (not shown in FIG. 1) in communications medium 106 is coupled to differential outputs of transmitter 110 via a correspond pair of connector pins 118, differential lines 122, and CM suppression module 112. Receiver 108 and transmitter 110 can be respective receiver and transmitter sections of a transceiver, such as an Ethernet transceiver.

In conventional communications system 100, CM noise (indicated by arrow 124) can be coupled to communications medium 106 as EMI, which can originate from nearby electronic devices, such as RF transmitters and cell phones, lightning discharges, electrostatic discharges, and the like. As the CM noise on communications medium 106 passes through connector 104, a portion of it (i.e. the CM noise) is converted by connector pins 118 into DM noise (indicated by dashed lines 126 and 128). Although CM suppression module 112 attenuates CM noise, it (i.e. CM suppression module 112) allows the DM noise to pass through substantially unattenuated to the differential inputs of receiver 108. The DM noise that is coupled to the differential inputs of receiver 108 can undesirably affect the operation of electronic device 102 by, for example, reducing the signal-to-noise ratio (SNR) of the device.

Also, in electronic device 102, a DM signal (indicated by dashed lines 130 and 132) that is generated by transmitter 110 can pass through CM suppression module 112 without being attenuated or suppressed. However, a portion of the DM signal generated by transmitter 110 can be converted by connector pins 118 in conventional connector 104 into CM noise, which can be coupled to communications medium 106, as indicated by arrow 134. The portion of the DM signal from transmitter 10 that is converted by connector pins 118 into CM noise can undesirably increase the CM noise emission of electronic device 102. As a result of the increased CM noise emission, Electromagnetic Compatibility (EMC) requirements of electronic device 102 can be more difficult to meet.

Although a clamp-on ferrite choke (not shown in FIG. 1) can be attached to communications medium 106 near conventional connector 104 to suppress CM noise, an undesirably large clamp-on ferrite choke can be required to provide a sufficiently high impedance so as to significantly reduce the CM noise. Also, a clamp-on ferrite choke is impractical where a large number of connectors are adjacent to one another, as required in, for example, a multi-port communications device, such as an Ethernet switch.

Figure 2:
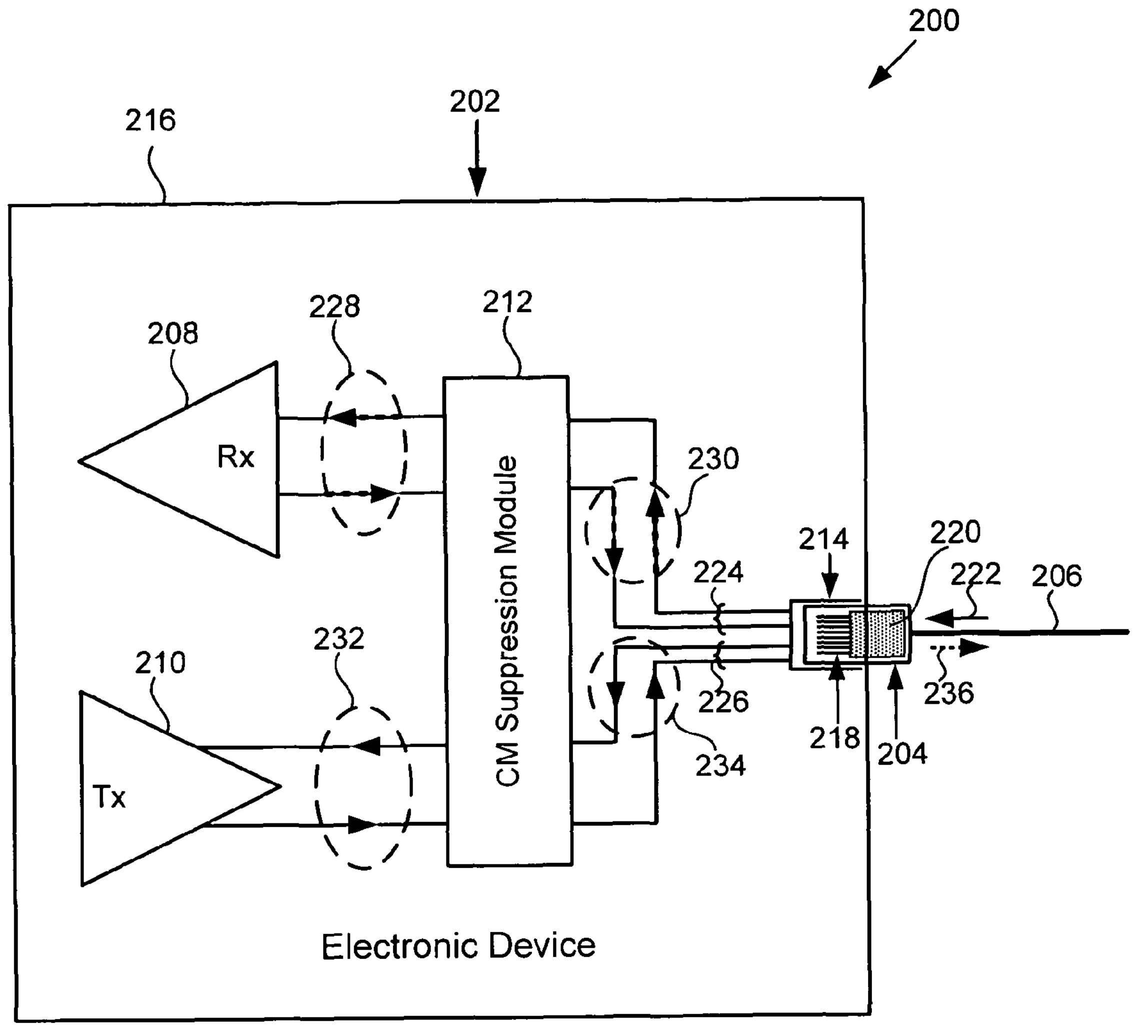
FIG. 2 illustrates a diagram of an exemplary electronic device coupled to an exemplary communications medium via an exemplary connector in accordance to one embodiment of the present invention.

FIG. 2 shows a diagram of an exemplary communications system including an exemplary electronic device coupled to an exemplary communications medium in accordance with one embodiment of the present invention. In FIG. 2, communications system 200 includes electronic device 202, connector 204, and communications medium 206, where connector 204 couples communications medium 206 to electronic device 202. Electronic device 202 includes receiver 208, transmitter 210, CM (common-mode) suppression module 212, receptacle 214, and circuit board 216 and connector 204 includes connector pins 218 and CM suppression block 220. Electronic device 202 can be a communications device, such as an Ethernet device. For example, electronic device 202 can be an Ethernet switch, an Ethernet card in a personal computer or a server, or other type of Ethernet device. Communications medium 206 can be, for example, a cable, such as a CAT 5, CAT 6A, or other type of Ethernet cable. It is noted that although a cable, such as an Ethernet cable, is used as a specific example of a particular form of communications media in the present application, the present invention is not limited to cables or specific types of cable.

As shown in FIG. 2, communications medium 206 is attached to connector 204 and coupled to CM suppression block 220 in connector 204, and CM suppression block 220 is coupled to connector pins 218 in connector 204. CM suppression block 220, which is integrated into connector 204, can be configured to attenuate (i.e. reduce) CM noise (indicated by arrow 222) on communications medium 206 before it (i.e. the CM noise) reaches connector pins 218 in connector 204. The CM noise (indicated by arrow 222) can be coupled to communications medium 206 as EMI (electromagnetic interference), which can originate from nearby electronic devices, such as RF transmitters and cell phones, lightning discharges, electrostatic discharges, and the like.

CM suppression block 220 can also be configured to allow a DM (differential-mode) signal to pass through with substantially no attenuation. By attenuating the CM noise before it reaches connector pins 218, an embodiment of the invention's CM suppression block 220 can significantly reduce the amount of DM noise that is converted by connector pins 218 in connector 204. CM suppression block 220 can comprise, for example, one or more CM chokes, which can have, for example, wire-wound ferrite cores, such as ferrite toroid cores. In one embodiment, CM suppression block 220 can comprise a transformer, which can have a center tap for providing CM noise suppression. Connector 204, which is attached to communications medium 206, can be, for example, a modular multi-pin plug, such as an RJ45 plug. In one embodiment, connector 204 can have eight pins, such as connector pin 218. In other embodiments, connector 204 can be a plug having more or less than eight connector pins. Communications medium 206 (e.g. an Ethernet cable) can include multiple differential pairs, where each differential pair can comprise a twisted pair of wires. In one embodiment, communications medium 206 can comprise four differential pairs. The differential pairs in communications medium 206 can be coupled to respective pairs of connector pins 218 in connector 204.

Also shown in FIG. 2, a pair of connector pins 218 associated with a corresponding differential pair (not shown in FIG. 2) in communications medium 206 is coupled to differential inputs of receiver 208 via receptacle 214, differential lines 224, and CM suppression module 212. Receptacle 214, which can be mounted on circuit board 216 or otherwise attached to electronic device 202, can be, for example, an RJ45 jack. CM suppression module 212 can comprise one or more CM chokes and/or one or more transformers configured to suppress CM noise. The CM chokes can have, for example, wire-wound ferrite cores, such as ferrite toroid cores. CM suppression module 212 can be configured to attenuate or suppress CM noise and to allow DM signals to pass through with substantially no attenuation. In one embodiment, CM suppression module 212 is not utilized in electronic device 202.

Further shown in FIG. 2, another pair of connector pins 218 that is associated with a corresponding differential pair (not shown in FIG. 2) in communications medium 206 is coupled to differential outputs of transmitter 210 via receptacle 214, differential lines 226, and CM suppression module 212. Receiver 208 and transmitter 210, which are mounted on circuit board 216, can be respective receiver and transmitter sections of a transceiver, such as an Ethernet transceiver.

In communications system 200, as CM noise on communications medium 206 passes through connector 204, a portion of it (i.e. the CM noise) can be converted by connector pins 218 in connector 204 into DM noise. However, as a result of the CM noise suppression provided by CM suppression block 220, which is integrated into connector 204, the amount of DM noise (indicated by dashed arrows encircled by dashed lines 228 and 230) that is converted by connector pins 218 in connector 204 can be significantly reduced. Although CM suppression module 212 suppresses CM noise, it (i.e. CM suppression module 212) allows the DM noise to pass through substantially unattenuated to the differential inputs of receiver 208.

Also, in electronic device 202, an intentional DM signal (indicated by dashed lines 232 and 234) generated by transmitter 210 can pass through CM suppression module 212 with substantially no attenuation. A portion of the DM signal that is generated by transmitter 210 can be converted by connector pins 218 in connector 204 into CM noise, which can be coupled to communications medium 206. However, as a result of the CM noise suppression provided by CM suppression block 220 in connector 204, the amount of CM noise (indicated by dashed arrow 236) that is coupled to communications medium 206 from connector pins 218 is significantly reduced.

Thus, by providing CM suppression block 220 in connector 204 between connector pins 218 and communications medium 206, an embodiment of the invention's connector 204 provides significantly less DM noise at the differential inputs of receiver 208 compared to the amount of DM noise provided by conventional connector 104 at the differential inputs of receiver 108 in electronic device 102 in FIG. 1. As a result, the SNR (signal-to-noise ratio) and the electrical noise immunity of electronic device 202 are significantly increased compared to electronic device 102, which is coupled to communications medium 106 by conventional connector 104.

Also, by integrating CM suppression block 220 into connector 204, an embodiment of the invention's connector 204 couples significantly less CM noise to communications medium 206 compared to the CM noise coupled to communications medium 106 by conventional connector 104 in FIG. 1. As a result, the CM noise emission of electronic device 102 can be significantly reduced compared to the CM noise emission of electronic device 102. As a result of the reduced CM noise emission provided by CM suppression block 220 in connector 204, electronic device 202 can more easily meet EMC requirements than electronic device 102.

Figure 3:
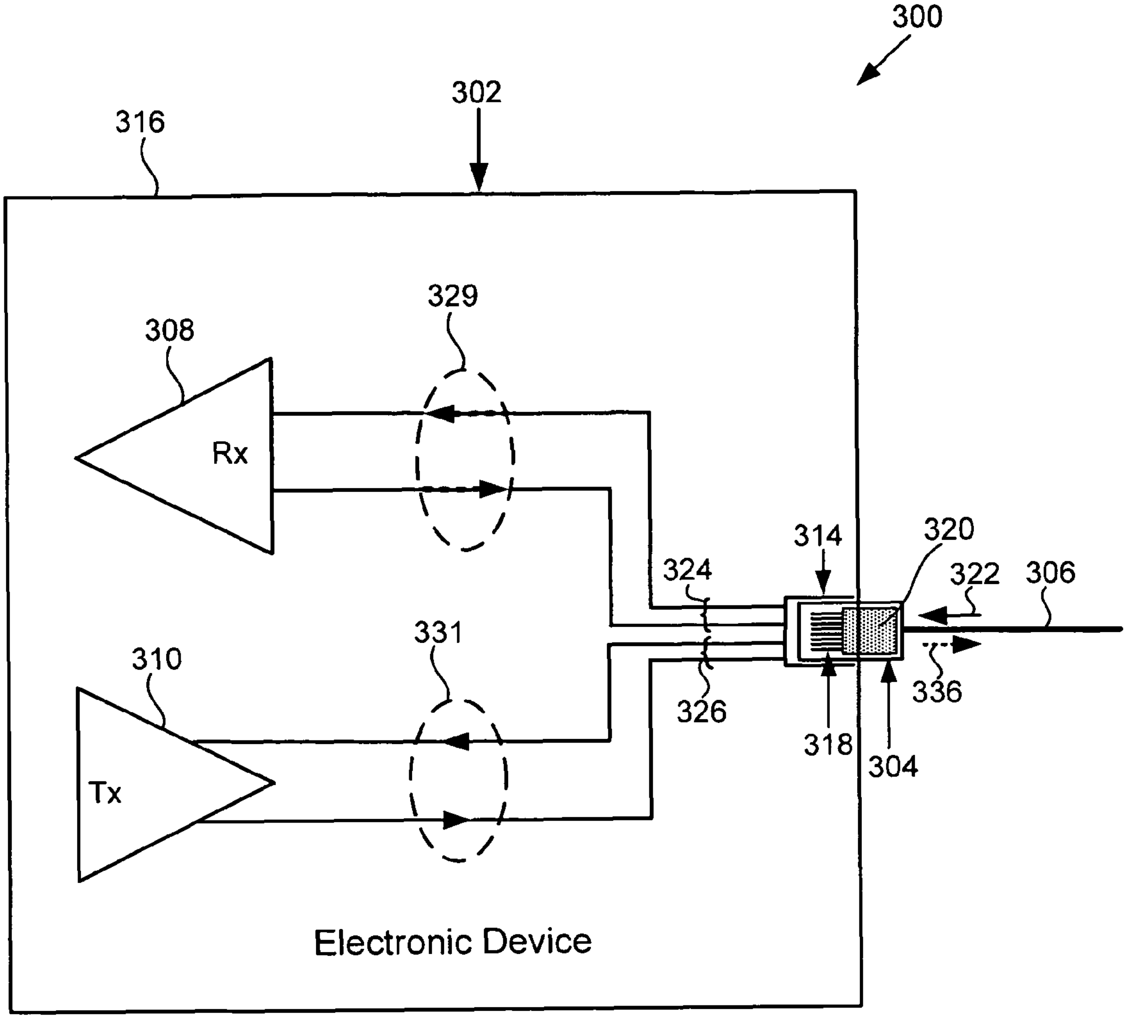
FIG. 3 illustrates a diagram of an exemplary electronic device coupled to an exemplary communications medium via an exemplary connector in accordance to another embodiment of the present invention.

FIG. 3 shows a diagram of an exemplary communications system including an exemplary electronic device coupled to an exemplary communications medium in accordance with one embodiment of the present invention. In FIG. 3, communications system 300 is similar to communications system 200 in FIG. 2, with a difference being that electronic device 302 in communications system 300 does not include an on-board CM suppression module, such as CM suppression module 212 in electronic device 202. In FIG. 3, connector 304, communications medium 306, receiver 308, transmitter 310, receptacle 314, connector pins 318, CM suppression block 320, arrows 322 and 336, and differential lines 324 and 326 correspond, respectively, to connector 204, communications medium 206, receiver 208, transmitter 210, receptacle 214, connector pins 218, CM suppression block 220, arrows 222 and 236, and differential lines 224 and 226 in FIG. 2.

In communications system 300, CM suppression block 320, which is integrated into connector 304 and coupled between connector pins 318 and communications medium 306, significantly reduces the amount of CM noise (indicated by arrow 322) on communications medium 306 that is coupled to connector pins 318. As a result, a significantly reduced amount of DM noise (indicated to dashed arrows encircled by dashed line 329) is coupled to the differential inputs of receiver 308 on differential lines 324. Also, in electronic device 302, CM suppression block 320 significantly reduces the amount of CM noise (indicated by arrow 336) that is coupled to communications medium 306 as a result of the conversion by connector pins 318 of a portion of the DM signal (indicated by dashed line 331) that is outputted by transmitter 310. Thus, the embodiment of the invention's connector 304 in communications system 300 in FIG. 3 provides similar advantages as the embodiment of the invention's connector 204 in communications system 200 in FIG. 2.

Figure 4:
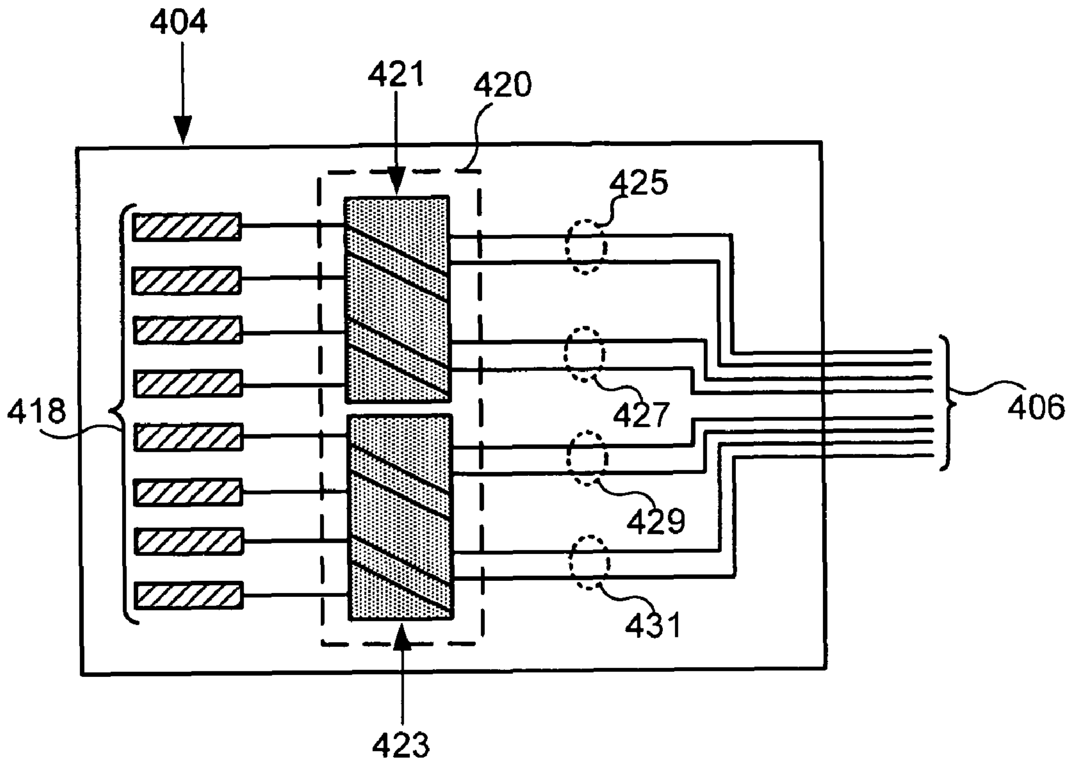
FIG. 4 illustrates a diagram of an exemplary connector for a communications medium in accordance with one embodiment of the present invention.

FIG. 4 shows a diagram of an exemplary connector in accordance with one embodiment of the present invention. In FIG. 4, connector 404, communications medium 406, and connector pins 418 correspond, respectively, to connector 204, communications medium 206, and connector pins 218 in FIG. 2. Also, CM conversion block 420 in FIG. 4 illustrations a particular implementation of CM conversion block 220 in FIG. 2. In FIG. 4, CM conversion block 420 comprises CM chokes 421 and 423 and communications medium 406 comprises differential pairs 425, 427, 429, and 431 (hereinafter referred to "differential pairs 425 through 431" in the patent application), which can each be a twisted pair of wires. In the embodiment in FIG. 4, communications medium 406 can comprise four differential pairs. In other embodiments, communications medium 406 may comprise less than or more than four differential pairs.

As shown in FIG. 4, differential pairs 425 and 427 are coupled to CM choke 421 and differential pairs 427 and 429 are coupled to CM choke 423. CM chokes 421 and 423 can each comprise, for example, a ferrite core, such as a ferrite toroid core. Differential pairs 425 and 427 can be wound around the ferrite core of CM choke 421 a sufficient number of times to achieve a desired inductance of CM choke 421. Similarly, differential pairs 429 and 431 can be wound around the ferrite core of CM choke 423 a sufficient number of times to achieve a desired inductance of CM choke 423. CM chokes 421 and 423 in CM suppression block 420 can be configured, for example, to attenuated CM noise, to allow a DM signal to pass through with substantially no attenuation, and to allow power over Ethernet to be utilized on communications medium 406 (e.g. an Ethernet cable).

Also shown in FIG. 4, differential pairs 425 through 431 are coupled to respective pairs of connector pins 418. The particular connectors pins that each of differential pairs 425 through 431 is coupled to can be selected to meet a particular wiring specification, such as a particular Ethernet wiring specification. The embodiment of the invention's connector 420 in FIG. 4 can provide similar advantages as the embodiment of the invention's connector 220 in FIG. 2.

Thus, as discussed above, by integrating a CM (common-mode) suppression block into a connector, such as an RJ45 plug, where the connector is attached to a communications medium, such as an Ethernet cable, and where the CM suppression block is coupled to the connector pins, the present invention advantageously reduces CM noise coupling between the communications medium and the connector pins. By reducing CM noise coupling between the communications medium and the connector pins, the present invention also advantageously reduces DM (differential-mode)

noise that can be coupled to an electronic device, such as an Ethernet device, via conversion from CM noise by the connector pins.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A connector for coupling a communications medium to an electronic device, said connector comprising:

a common-mode suppression block coupled to a plurality of connector pins;

said common-mode suppression block being configured to reduce common-mode noise coupling between said communications medium and said plurality of connector pins.

2. The connector of claim 1, wherein said common-mode suppression block comprises at least one common-mode choke configured to attenuate said common-mode noise.

3. The connector of claim 2, wherein said at least one common-mode choke comprises a ferrite toroid core.

4. The connector of claim 1, wherein said connector is an RJ45 plug.

5. The connector of claim 1, wherein said communications medium is an Ethernet cable.

6. The connector of claim 1, wherein said common-mode suppression block comprises two common-mode chokes.

7. The connector of claim 6, wherein each of said two common-mode chokes is coupled to two differential pairs in said communications medium.

8. The connector of claim 1, wherein said common-mode suppression block is further configured to allow power over Ethernet to be utilized on said communications medium.

9. The connector of claim 1, wherein said common-mode suppression block comprises a transformer configured to attenuate said common-mode noise.

10. The connector of claim 1, wherein said common-mode suppression block is further configured to provide substantially no attenuation to a differential-mode signal.

11. A communications system comprising:

an electronic device coupled to a communications medium via a connector attached to said communications medium;

said connector comprising a plurality of connector pins and a common-mode suppression block;

said common-mode suppression block being configured to reduce common-mode noise coupling between said communications medium and said plurality of connector pins.

12. The communications system of claim 11, wherein said common-mode suppression block comprises at least one common-mode choke configured to attenuate said common-mode noise.

13. The communications system of claim 12, wherein said at least one common-mode choke comprises a ferrite toroid core.

14. The communications system of claim 11, wherein said communications medium is an Ethernet cable.

15. The communications system of claim 11, wherein electronic device comprises a common-mode suppression module coupled to said plurality of connector pins in said connector.

16. The communications system of claim 11, wherein said electronic device comprises an RJ45 jack coupled to said connector.

17. The communications system of claim 11, wherein said common-mode suppression block comprises two common-mode chokes, and wherein each of said two common-mode chokes is coupled to two differential pairs in said communications medium.

18. The communications system of claim 11, wherein said common-mode suppression block is further configured to allow power over Ethernet to be utilized on said communications medium.

19. The communications system of claim 11, wherein said common-mode suppression block reduces differential-mode noise in said electronic device.

20. The communications system of claim 11, wherein said electronic device is an Ethernet device.

* * * * *